United States Patent
Fu

Patent Number: 6,064,095
Date of Patent: *May 16, 2000

[54] LAYOUT DESIGN OF ELECTROSTATIC DISCHARGE PROTECTION DEVICE

[75] Inventor: Kuan-Yu Fu, Hsinchu, Taiwan

[73] Assignee: United Microelectronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/072,156

[22] Filed: May 4, 1998

[30] Foreign Application Priority Data

Mar. 10, 1998 [TW] Taiwan ................................. 87103460

[51] Int. Cl.⁷ .......................... H01L 23/62; H01L 29/76; H01L 29/00
[52] U.S. Cl. ........................... 257/355; 257/401; 257/529
[58] Field of Search ................................. 257/355, 356, 257/357, 358, 359, 360, 361, 362, 363, 546, 547, 173, 528, 529

[56] References Cited

U.S. PATENT DOCUMENTS

| | | | |
|---|---|---|---|
| 4,517,583 | 5/1985 | Uchida | 257/67 |
| 4,987,325 | 1/1991 | Seo | 307/465 |
| 5,282,165 | 1/1994 | Miyake et al. | 365/200 |
| 5,442,587 | 8/1995 | Kuwagata et al. | 365/200 |
| 5,629,898 | 5/1997 | Idei et al. | 365/222 |
| 5,661,323 | 8/1997 | Choi et al. | 257/378 |
| 5,663,589 | 9/1997 | Saitoh et al. | 257/401 |
| 5,721,439 | 2/1998 | Lin | 257/379 |
| 5,742,083 | 4/1998 | Lin | 257/360 |
| 5,763,919 | 6/1998 | Lin | 257/363 |

FOREIGN PATENT DOCUMENTS 403073574 3/1991 Japan ..................................... 257/355

*Primary Examiner*—Tom Thomas
*Assistant Examiner*—Ori Nadav

[57] ABSTRACT

A layout design for an electrostatic discharge protection device formed above a first type of semiconductor substrate. This electrostatic discharge protection device comprises a gate region having a tortuous but continuous structure located above the first type semiconductor substrate, a common source region in the first type semiconductor substrate located on one side of the gate region, a multiple of separate drain regions in the first type semiconductor substrate located on the other side of the gate region, a multiple of contact openings distributed over the common source region and the drain regions, and, a conductive runner having a width narrower than the drain region electrically connected to each drain region.

20 Claims, 2 Drawing Sheets

LAYOUT DESIGN OF ELECTROSTATIC DISCHARGE PROTECTION DEVICE

CROSS-REFERENCE TO RELATED APPLICATION

This application claims the priority benefit of Taiwan application serial no. 87103460, filed Mar. 10, 1998, the full disclosure of which is incorporated herein by reference.

BACKGROUND OF THE INVENTION

1. Field of Invention

The present invention relates to a layout design of an electrostatic discharge (ESD) protection device. More particularly, the present invention relates to the layout design of an ESD protection device having metal runners that function as fuses for better electrostatic discharge protection.

2. Description of Related Art

Input signals to metal oxide semiconductor (MOS) integrated circuits (ICs) are supplied through the gate of a MOS transistor. If a high voltage is supplied to the gate terminal, the gate oxide layer may not be able to withstand the high voltage and soon breaks down. Although the operating voltage of an IC, which is around 5 V, will not cause voltage break down, voltages higher than the normal input voltage can sometimes be produced when the devices are transported by humans or machines. In fact, the sources for generating these abnormally high voltages are many. For example, electric charges can be produced through friction between surfaces or when the IC is unpacked from plastic packaging. The amount of static electricity generated this way can range from several hundreds volts to several thousand volts. If such high voltages are accidentally allowed to touch the pins of an IC package, voltage break down of the gate oxide layer of a transistor within the package is inescapable. Consequently, the transistor is unable to function properly leading to device failure.

To prevent damages to the MOS gate terminals, protective circuits are wired to all the pins of a MOS IC package. In general, protective circuits are also used in very large-scale integrated (VLSI) circuits. These protective circuits are normally installed between input/output (I/O) pads and the transistor gates in an integrated circuit. The protective circuits are designed such that they are capable of conducting or withstanding high voltages. Hence, these protective circuits provide an electrical path to a ground or a connection to an electrostatic discharge protective device on a power supply casing.

The mechanism for ESD protection is closely related to the snap-back mechanism between a drain terminal and a source terminal. When the snap-back mechanism of a protection device is triggered, the protection device will enter a low resistance state. Using a MOS transistor's protection device as an example, when an ESD event occurs, the protection device will be triggered. Subsequently, the voltage between the drain terminal and the source terminal will be lowered to a snap-back voltage, which is even lower than the triggering voltage. The snap-back voltage is used to absorb the ESD current and to protect the transistors that are used for carrying out logic operations in an integrated circuit.

In general, for VLSI circuits, large-sized MOS transistor structures are used as ESD protection devices. The zapping voltage of an ESD protection device must be restricted to a value below the so-called second break down voltage. The second break down voltage often occurs in the weak spots of a circuit, for example, local drain spots. The break down may be caused by some manufacturing defects. These defects tend to increase the production of hot channel current, and the heat generated by the current may lead to a second break down. Once a second break down occurs, large amounts of circuit currents will flow into these regions damaging the ESD protection device and causing it to malfunction.

In light of the foregoing, there is a need to provide a better design layout for the ESD protection device.

SUMMARY OF THE INVENTION

Accordingly, the present invention provides a layout design for an electrostatic protection (ESD) device employing a fuse structure so that even when a second break down occurs at some local points, the ESD protection device can still maintain sufficient protection for the whole circuitry.

To achieve these and other advantages and in accordance with the purpose of the invention, as embodied and broadly described herein, the invention provides a layout design for an ESD protection device. The ESD protection device is formed above a first type of semiconductor substrate. This ESD protection device comprises the following: a gate region having a tortuous but continuous structure located above the first type semiconductor substrate; a common source region in the first type semiconductor substrate located on one side of the gate region; a multiple of separate drain regions in the first type semiconductor substrate located on the other side of the gate region; a multiple of contact openings distributed over the common source region and the drain regions; and, a conductive runner electrically connected to each drain region and functioning as a protective fuse, where the conductive runner's width is narrower than the drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
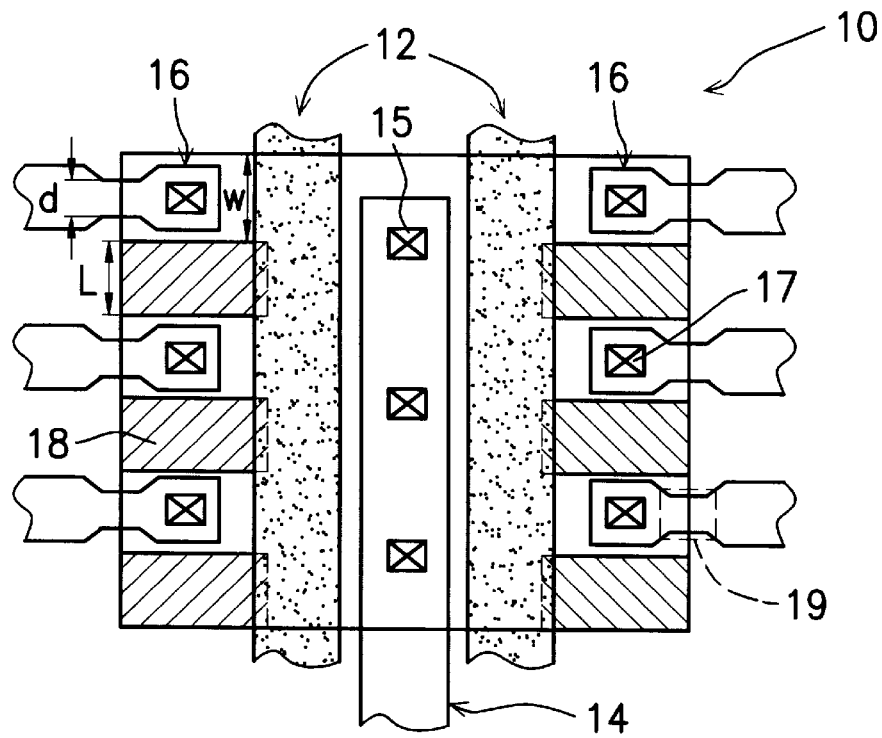
FIG. 1 is a top view showing the layout design of an electrostatic discharge protection device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

The electrostatic discharge protection device provided by this invention has a multiple of separate drain regions. A narrow metal runner is connected to each drain region to function as a protective fuse. Should a large electrostatic discharge current flow into any particular drain region and cause a second break down, the metal runner will be melted away, cutting off its connection with the drain region. One advantage of the cut-off is that the existence of a certain weak spot in the drain region will not damage the whole protection device. Secondly, the remaining drain regions are more capable of withstanding an even higher second break down voltage. Consequently, the device becomes increasingly robust and the protective power of the ESD protection device is correspondingly raised.

FIG. 1 is a top view showing the layout design of an electrostatic discharge protection device according to one preferred embodiment of this invention. As shown in FIG. 1, the electrostatic discharge protection device 10 is formed above a first type semiconductor substrate (not shown in the Figure), for example, a P-type semiconductor substrate. The ESD protection device 10 includes a gate region 12 having a tortuous but continuous structure. The gate region 12 is preferably a doped polysilicon layer. Two regions in the semiconductor substrate are formed on each side of the gate region by doping second type ions (for example, N-type ions) into the semiconductor substrate. On one side of the gate region 12 is a common source region 14, while on the other side is a multiple of separate drain regions 16. Each drain region has a width of W, preferably of about 4 $\mu$m. A number of contact openings 15 are distributed over the common source region 14 for electrical connection with a source metallic layer (not shown). Each drain region 16 also has a contact opening 17 for electrical connection with a drain metallic layer (not shown). Between two neighboring drain regions 16, there is an insulating structure 18, for example, a field oxide layer, for electrically isolating one drain region 16 from another. Each isolating structure 18 has a width of L, preferably of about 0.4 $\mu$m.

According to the ESD protection device 10 of this invention, each drain region 16 is electrically connected to the drain metallic layer through a contact opening 17 and a metal line. However, before the metal line reaches the drain metallic layer, the metal line has a short narrow structure called a metal runner 19. The metal runner 19 has a width d, which is smaller than the width W of the drain region 16. The metal runner 19 preferably has a width d of about 0.5 $\mu$m or smaller. The metal runner 19 functions as a metallic fuse. When a second voltage breakdown occurs in a particular drain region 16, a high current will pass through the metal runner 19, generating enough heat to melt away the runner 19. Consequently, that part of the circuit becomes an open circuit and current can no longer flow into drain region 16. Although the drain region 16 is cut-off and no longer can participate in ESD protection, the cut-off region is really the weakest area for the flow of current. Therefore, the remaining drain regions 16 are more capable of supporting a larger electric current than the cut-off region, and will be less vulnerable to second breakdown. Hence, the remaining device structure is more robust resulting in a higher ESD protection for the devices.

Figure 2:
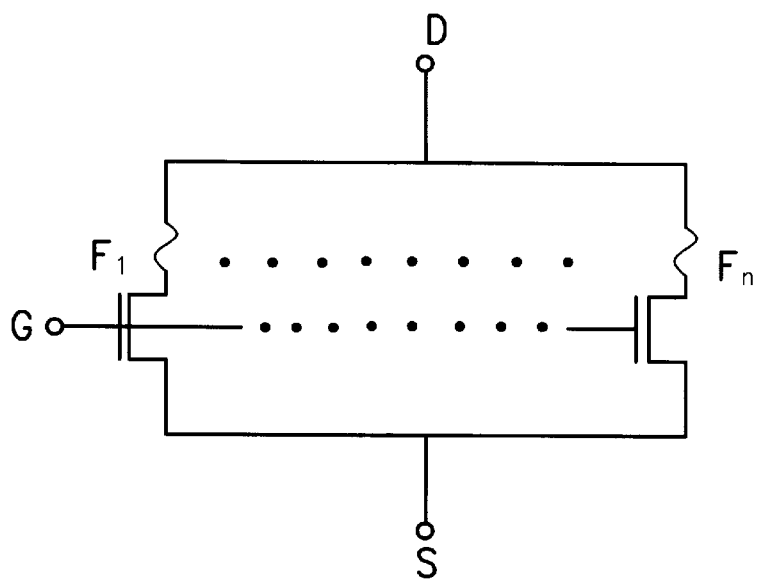
FIG. 2 is an equivalent circuit diagram of the electrostatic discharge protection device according to one preferred embodiment of this invention.

FIG. 2 is an equivalent circuit diagram of the electrostatic discharge protection device according to one preferred embodiment of this invention. As shown in FIG. 2, label G represents the gate terminal connecting to an external gate signal; label S represents the common source terminal connecting to an external source signal; and label D represents the drain terminal of each device connecting to an external drain signal. Between the drain terminal D and the gate terminal G, there are altogether n metal runners F connected in parallel and acting as protective fuses between each drain terminal and the gate terminal, for example, fuses $F_l$ to $F_n$.

Figure 3:
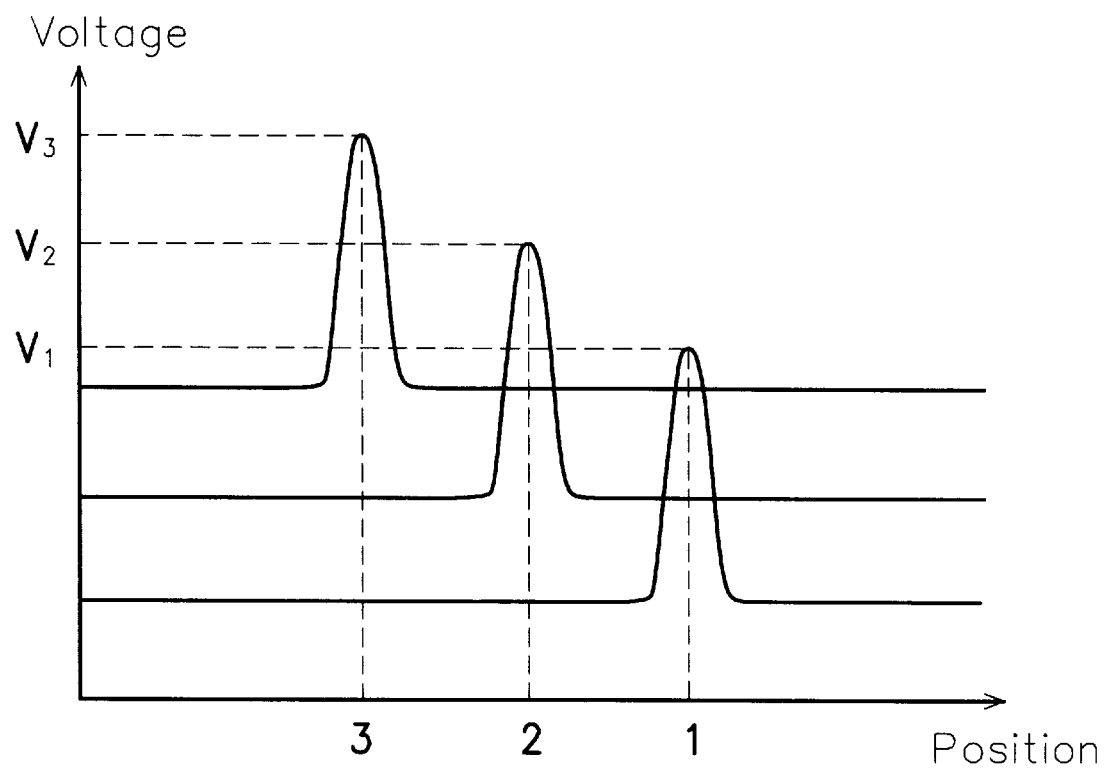
FIG. 3 is a diagram showing the break down voltages in different locations of an electrostatic discharge protection device according to one preferred embodiment of this invention.

FIG. 3 is a diagram showing the break down voltages in different locations of an electrostatic discharge protection device according to one preferred embodiment of this invention. In FIG. 3, the horizontal axis represents three different positions 1, 2 and 3 in different regions of an ESD protection device. The vertical axis represents the value of second break down voltage in different regions. From FIG. 3, it can be easily observed that different regions can withstand different second break down voltage. For example, positions 1, 2 and 3 correspond to three different second break down voltages $V_1$, $V_2$ and $V_3$ respectively. As shown in FIG. 3, the second break down voltage that location 1 can support $V_1$ is the lowest. In other words, location 1 is the weakest spot. Therefore, as soon as an ESD event occurs, the fuse running to the first regional point is the first to be melted away due to the running of a large current. Hence, an open circuit is formed cutting off current into the region. Thereafter, this region can no longer be protected under the ESD protection device. However, the cutoff location 1 is the weakest area for current flow. Hence, the remaining locations 2 and 3 are more capable of supporting a higher current flow without a second voltage break down. Consequently, the remaining device structure is more robust and has a higher ESD protection capacity.

Following the above reasoning, the second break down voltage that location 2 can support $V_2$ is now the lowest. In other words, location 2 now becomes the weakest spot. Therefore, as soon as another ESD event occurs, the fuse to the location 2 is the first to be melted away due to the flow of a large current. Hence, an open circuit is formed cutting off current flow into the region. Thereafter, this region can no longer be protected under the ESD protection device. However, the cut-off location 2 is the weakest area for a running current in this case. Hence, the remaining region 3 is more capable of supporting a higher running current without second voltage break down. Consequently, the remaining device structure is even more robust and has an even higher ESD protection capacity.

In summary, the advantages of this invention include:

(1) The ESD protection device has a plurality of separate drain regions. Even when some of the fuses leading to these regions are burnt away, only portion of the regions will be cut off from the device, and the remaining parts of the device can still provide an ESD protective function. Hence, ESD protective function is present despite the occurrence of a second voltage break down in a particular region or regions.

(2) The ESD protection device has a metal runner 19 between each separate drain terminal and the gate terminal, and the metal runner 19 can function as a fuse. Therefore, when an ESD event occurs, only the fuse running to the weakest region is melted away and disconnected from the device. Hence, ESD protective function is present despite the occurrence of a second break down in the device's weakest region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection device formed on a first type semiconductor substrate, comprising:

a gate having a continuous structure located above the first type semiconductor substrate;

a common source region in the first type semiconductor substrate located on one side of the gate;

a plurality of drain regions in the first type semiconductor substrate located on the other side of the gate just opposite the common source region, wherein each of the drain regions is electrically isolated from each other and has separated connection to the gate;

a plurality of contacts distributed over the common source region and the drain regions; and a plurality of separated metal runners electrically connected to the drain regions, respectively, wherein anyone of the metal runners is melted away when an over-high ESD current flows through one of the metal runners into a corresponding one of the drain regions, resulting in a disconnection from the over-high ESD current.

2. The device of claim 1, wherein the common source region is doped using a second type of ions.

3. The device of claim 1, wherein the drain regions are doped using a second type of ions.

4. The device of claim 1, wherein an insulating structure is further included between neighboring drain regions for electrically isolating each of the drain regions from the other.

5. The device claim 1, wherein each of the metal runners has a width narrower than the drain regions.

6. The device of claim 1, wherein each drain region has a width of about 4 $\mu$m.

7. The device of claim 1, wherein each of the metal runners has a width of about 0.5 $\mu$m or smaller.

8. An electrostatic discharge (ESD) protection device formed on a first type semiconductor substrate, comprising:

a gate having a continuous structure located above the first type semiconductor substrate;

a common source regions in the first type semiconductor substrate located on one side of the gate, wherein the source region is electrically connected to a source metallic layer;

a plurality of drain regions in the first type semiconductor substrate located on the other side of the gate just opposite the common source regions, wherein the drain regions are connected to a main drain metallic layer and each of the drain regions is electrically isolated from each other and has separated connection to the gate;

a plurality of contacts distributed over the common source region and the drain regions for electrically connecting the common source region to the source metallic layer and the drain regions to the main metallic layer; and a plurality of metal runners for electrically connecting the drain regions, respectively, to the main drain metallic layer, wherein anyone of the metal runners having an over-high ESD current is melted away, resulting in a disconnection.

9. The device of claim 8, wherein the common source region is doped using a second type of ions.

10. The device of claim 8, wherein the drain regions are doped using a second type of ions.

11. The device of claim 8, wherein an insulating structure is further included between neighboring drain regions for electrically isolating the each of the drain regions from the other.

12. The device of claim 11, wherein the insulating structure includes a field oxide layer.

13. The device of claim 11, wherein the insulating structure has a width of about 0.4 $\mu$m.

14. The device of claim 8, wherein the metal runners have a width d narrower than a width w of the drain regions in order to function as a metallic fuse.

15. The device of claim 8, wherein each drain region has a width of about 4 $\mu$m.

16. The device of claim 8, wherein the metal runners have a width of about 0.5 $\mu$m or smaller.

17. An electrostatic discharge protection device formed on a first type semiconductor substrate, comprising:

a gate located above the first type semiconductor substrate;

a common source region in the first type semiconductor substrate located on one side of the gate;

a plurality of drain regions in the first type semiconductor substrate located on the other side of the gate, wherein each of the drain regions is electrically isolated from each other and has separated connection to the gate;

a plurality of contacts distributed over the common source region and the drain regions; and a plurality of conductive runners each of which is electrically interposed between a drain connect and a main metallic layer, each runner being sized to melt at a predetermined current in order to interrupt the electrical connection of the runner that melts, when an over-high ESD current flows through one of the metal runners.

18. The device of claim 1, wherein the device comprises a plurality of isolation structures used to electrically isolate each of the drain regions, and the isolation structures do not cross over the gate to extend to the common source region.

19. The device of claim 8, wherein the device comprises a plurality of isolation structures used to electrically isolate each of the drain regions, and the isolation structures do not cross over the gate to extend to the common source region.

20. The device of claim 17, wherein the device comprises a plurality of isolation structures used to electrically isolate each of the drain regions, and the isolation structures do not cross over the gate to extend to the common source region.

* * * * *